United States Patent [19]
Jacobs

[11] Patent Number: 5,929,512
[45] Date of Patent: Jul. 27, 1999

[54] URETHANE ENCAPSULATED INTEGRATED CIRCUITS AND COMPOSITIONS THEREFOR

[76] Inventor: Richard L. Jacobs, 1630 Fiske Pl., Oxnard, Calif. 93030

[21] Appl. No.: 08/819,819

[22] Filed: Mar. 18, 1997

Related U.S. Application Data

[60] Provisional application No. 60/013,688, Mar. 19, 1996.

[51] Int. Cl.$^6$ .................................................. H01L 23/495
[52] U.S. Cl. ......................... 257/667; 257/788; 257/790
[58] Field of Search ................................. 257/787–795, 257/667; 438/106–125

[56] References Cited

U.S. PATENT DOCUMENTS

| | | | |
|---|---|---|---|
| 3,953,877 | 4/1976 | Sigusch et al. .......................... | 257/788 |
| 5,285,104 | 2/1994 | Kondo et al. ............................ | 257/667 |
| 5,397,401 | 3/1995 | Toma et al. .............................. | 257/789 |
| 5,457,341 | 10/1995 | West ........................................ | 257/666 |
| 5,637,156 | 6/1997 | Kubota et al. .......................... | 257/788 |
| 5,637,914 | 6/1997 | Tanaka et al. .......................... | 257/666 |
| 5,641,996 | 6/1997 | Omoya et al. .......................... | 257/787 |
| 5,731,629 | 3/1998 | Woodward .............................. | 257/787 |

FOREIGN PATENT DOCUMENTS

| | | | |
|---|---|---|---|
| 2-310955 | 12/1990 | Japan ..................................... | 257/667 |

*Primary Examiner*—David B. Hardy
*Attorney, Agent, or Firm*—Louis J. Bachand

[57] ABSTRACT

Composition, method, and products for the environmental protection of integrated circuits comprising a robotically dispensible, wave solderable, low moisture absorbing urethane polymer reaction product of an aliphatic isocyanate, a flexibilizing low molecular weight rubbery polymer having isocyanate reactive hydroxyl terminals, and a diamine arranged to bodily encapsulate the integrated circuit within a dam of thixotropic version of the same polymer, the encapsulation being free of popcorning response to rapid heat rise after high humidity conditioning and otherwise superior as an IC encapsulant.

39 Claims, 2 Drawing Sheets

URETHANE ENCAPSULATED INTEGRATED CIRCUITS AND COMPOSITIONS THEREFOR

REFERENCE TO RELATED APPLICATION

This application claims the benefit of United States Provisional application Ser. No. 60/013,688 filed Mar. 19, 1996.

TECHNICAL FIELD

This application relates to compositions and method for the environmental protection by hermetic encapsulation of integrated circuits, and, more particularly, to compositions and method useful for encapsulating integrated circuits mounted on circuit boards on site in the process of manufacture of such boards. A substantial amount of circuit board manufacture occurs in Southeast Asia, an area with low labor rates, but very high humidity. There is need for a circuit board encapsulation technology which meets all electronic criteria and which, as well, is impervious to failure modes stemming from a highly humid environment.

The present invention provides this encapsulating composition, methods of encapsulation based on the composition, and novel structures and encapsulated products.

The term integrated circuit herein refers to assemblies of electronic components and conductive connectors in supported relation, e.g., on a board. In a particular aspect, this invention provides urethane polymer compositions useful to encapsulate integrated circuits to protect such circuits from shock and stress, which compositions are: Free of contaminants; Readily applied by automated processes including use of robotic dispensers; Fast and conveniently curable; Tack-free curing; Non-absorptive of ambient moisture; Dimensionally stable under processing conditions sufficiently to not unduly stress the attachment of the integrated circuit chip to the board substrate, the attachment of the encapsulant to the chip including at the edges and corners thereof, the attachment of the encapsulant to the board substrate, or the attachment of the encapsulant to projecting wires and wire attachments; Resistant to deterioration when immersed in hot solder; and, Free of bubble-induced failures, the so-called "popcorning" when heated rapidly in a solder immersion bath, even after continued exposure to ambient high humidity.

BACKGROUND OF THE INVENTION

Integrated circuits have been encapsulated in the past but no known encapsulating material or method provides the above-enumerated benefits of the present invention, each critical to an improved manufacturing standard.

SUMMARY OF THE INVENTION

It is accordingly an object of the invention to provide a novel composition useful in encapsulating integrated circuits. More particularly, it is an object to provide a urethane polymer composition and encapsulating method which meets or exceeds all present manufacturing standards. It is another object to provide circuit boards and other electronic assemblies in which integrated circuits are encapsulated in accordance with the invention.

These and other objects of the invention to become apparent hereinafter are realized in a composition comprising a urethane reaction product having only carbon to carbon bonds between successive carbon atoms, and which is highly thermally stable and low in moisture absorption and made with certain saturated, e.g., aliphatic isocyanates, flexibilizing, rubbery hydrocarbon polymers, and diamines as the principal reagents. A typical encapsulating composition according to the invention comprises a first side comprising an aliphatic diisocyanate and an aliphatic hydrocarbon having terminal substituents reactive with the diisocyanate, e.g. hydroxyl groups, and a second side comprising an aliphatic hydrocarbon having terminal substituents reactive with the diisocyanate and an amine such as an aromatic diamine, in reactive proportions to yield a curable mixture having the properties of the present invention.

In particular, the invention provides an encapsulated integrated circuit, the integrated circuit being encapsulated with a flexibilized urethane polymer. The flexibilized urethane polymer comprises the reaction product with a difunctional amine of a urethane prepolymer reaction product of an aliphatic isocyanate reagent and an isocyanate-reactive terminated flexibilizing polymer reagent. The isocyanate-reactive flexibilizing polymer reagent preferably comprises a polymer of butadiene terminated with isocyanate-reactive moieties, e.g., the isocyanate-reactive moieties comprises hydroxyl groups. Typically, the isocyanate-reactive flexibilizing polymer reagent has a molecular weight between about 50 and about 10,000 and may before reaction with the isocyanate reagent be liquid and have an hydroxyl functionality of about 2.0 to 3.5. Preferably, the aliphatic isocyanate reagent comprises a cycloaliphatic diisocyanate, e.g. methylenedicyclohexane-4,4'-diisocyanate, or diphenylymethane diisocyanate, isocyanurate, or isophorone diisocyanate. Preferably, the difunctional amine comprises an aromatic diamine, e.g. diethyltoulenediamine or metaxylenediamine.

In a particularly preferred form, the invention provides an encapsulated integrated circuit, the integrated circuit being encapsulated with a first and second flexibilized urethane polymer portions, the first polymer portion surrounding the integrated circuit in dam defining relation, the second polymer portion encapsulating the integrated circuit in dam confined relation.

In this and like embodiments, each of the first and second polymer portions comprises the reaction product with a difunctional aromatic amine of a urethane prepolymer reaction product of a cycloaliphatic isocyanate reagent and an isocyanate-reactive terminated flexibilizing polymer reagent comprising a polymer of butadiene terminated with isocyanate-reactive moieties, the first polymer portion additionally comprising thixotroping agents in an amount blocking sagging of the dam defining first polymer portion, the thixotroping agent typically being organic.

In this method aspects, the invention provides the method of protecting against environmental damage an integrated circuit secured in place on a board, including depositing and curing about the integrated circuit from a first blend of reactive urethane polymer precursors a dam, depositing and curing an encapsulating amount of a second blend of reactive urethane precursors on the integrated circuit in dam-confined relation, and curing the polymer blends in situ.

In this and like embodiments, there is further included for each of the first and second blends combining reactive pairs of individual urethane polymer precursors from a corresponding pair of dispensers having a common outlet through a static mixer to form the respective first and second blends of polymer precursors; also selecting as the first blend pair of urethane polymer precursors a difunctional aromatic amine and a urethane prepolymer reaction product of a saturated, e.g., cycloaliphatic isocyanate reagent and an isocyanate-reactive terminated flexibilizing butadiene polymer reagent, the butadiene polymer being terminated with isocyanate-reactive moieties, the urethane polymer additionally comprising thixotroping agents in an amount blocking sagging of the deposit of the polymer upon deposit about the integrated circuit; also selecting as the second blend pair of urethane polymer precursors a difunctional aromatic amine and a urethane prepolymer reaction product of a saturated, e.g., cycloaliphatic isocyanate reagent and an isocyanate-reactive terminated flexibilizing butadiene polymer reagent, the butadiene polymer reagent being terminated with isocyanate-reactive moieties; and, also selecting as the second blend pair of urethane polymer precursors a difunctional aromatic amine and a urethane prepolymer reaction product of a saturated, e.g., cycloaliphatic isocyanate reagent and an isocyanate-reactive terminated flexibilizing butadiene polymer reagent, the butadiene polymer reagent being terminated with isocyanate-reactive hydroxyl groups.

In its composition aspects the invention provides a composition for environmentally protecting an integrated circuit, the composition comprising the urethane polymer reaction product of an aliphatic isocyanate reagent, an isocyanate-reactive terminated flexibilizing polymer reagent, and a diamine reagent under urethane polymer forming conditions.

In this and like embodiments, typically, the aliphatic isocyanate reagent is a cycloaliphatic isocyanate reagent, and e.g., comprises methylenedicyclohexane-4,4'-diisocyanate, or the isocyanate can be one or more of diphenylmethane diisocyanate, isocyanurate, and isophorone diisocyanate; the isocyanate-reactive flexibilizing polymer reagent comprises a polymer of butadiene terminated with isocyanate-reactive moieties; the isocyanate-reactive moieties comprise hydroxyl groups, the isocyanate-reactive flexibilizing polymer reagent has a molecular weight between about 50 and about 10,000, or more particularly a molecular weight between about 1000 and 5000 and is liquid and has an hydroxyl functionality of about 2.0 to 3.5; the isocyanate reagent comprises methylenedicyclohexane-4,4'-diisocyanate; the aromatic diamine comprises diethyltoluenediamine or meta-xylenediamine, or the isocyanate reagent comprises diphenylmethane diisocyanate and the aromatic diamine comprises diethyltoluenediamine or meta-xylenediamine; the urethane polymer is the reaction product of a first mixture comprising the isocyanate reagent and the flexibilizing polymer reagent and a second mixture comprising the diamine reagent and the flexibilizing polymer reagent.

In highly particularly preferred embodiments of the invention the composition urethane polymer is free of ether bonds between adjacent carbon atoms, and in certain of these embodiments, the composition urethane polymer comprises solely hydrocarbon bonds between successive, adjacent carbon atoms.

Finally, the invention provides the novel combination of the above-identified flexibilized urethane reaction product of cycloaliphatic isocyanates, rubbery hydrocarbon polymers and aromatic diamines with an integrated circuit environmentally protected by the composition.

BRIEF DESCRIPTION OF THE DRAWINGS

The invention will be further described with reference to the attached drawings in which.

DESCRIPTION OF THE PREFERRED EMBODIMENTS

Figure 1:
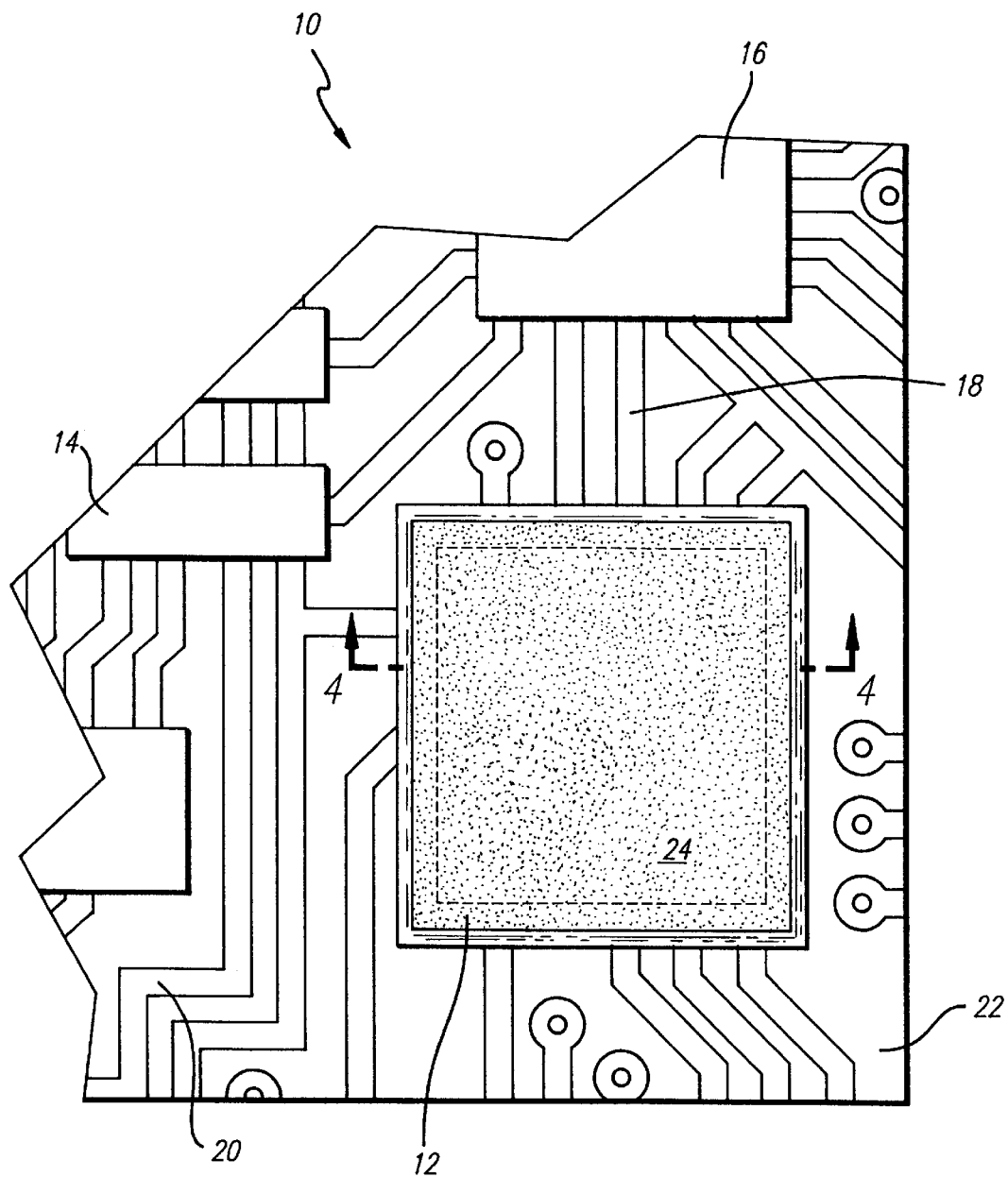
FIG. 1 is a plan view of a chip-on-board structure with an IC component surrounded with a urethane polymer dam and with encapsulation in accordance with the invention.

The invention composition and structures answer presently pressing problems in manufacture of integrated circuits. Historically, silicon-based transistors have been miniaturized into multichip integrated circuits (ICs) which have then been assembled in various configurations on printed circuit boards (PCBs). The assemblage of many thousands of these ICs, side-by-side and layered, has been successful based on placing these active devices within sealed packages. These sealed packages consist of the IC bonded to a substrate which provides inter-connects through a lead frame or grid (ball, pin, etc.), and encased in plastic molding material. When multiple IC's are used on a single package, a new package technology, these packages must protect the ICs both mechanically and hermetically from outside environmental factors as well as from mechanical shock.

But mechanical and environmental protection are not the only criteria that must be met by a protective encasement. The integrated circuits must also be protected from the migration of ions across the electron neutral and electron deficient layers of the transistors, otherwise the transistors can become "poisoned" and lose their assigned functions. Thus, the plastics packages themselves must be extremely clean or they will contribute to the poisoning process. In the past, ICs have been hermetically encapsulated in epoxy novolac plastic packages. These packages have approximate dimensions ranging from 100 to 1000 mils square by 100 to 500 mils thick. The materials from which the packages are made are selected for being clean of any metallic or organic salts which might migrate to the transistor surfaces, become imbedded and "poison" the circuitry. The institute of Printed Circuits (IPC) has suggested a specification for chloride content, for example, in which the plastic is held at 2 ppm by weight of chlorides. This level is sufficiently low to prevent substantial failure to the devices due to poisoning of transistors.

Among the available epoxy novolac plastics those have been used which provide a high degree of stability towards thermal degradation and have a controlled coefficient of expansion. Thermally stable packages are required because they must be assembled to the PCB so their wire attachments can be wave soldered to the remaining circuitry on the PCB. The wave soldering or solder reflow process require the PCBs and components to be endure solder temperatures of approximately 450° F. for up to 3 minutes. During this process, the packages must not expand to any substantial degree, they must not warp, and they must not bubble or outgas. The suitability of epoxy novolac plastics is not universal and they are sometimes difficult to obtain in the marketplace with the required purity.

ICs are also mounted directly on boards, if only in limited-size chip-on-board (COB) package applications. Instead of placing the ICs in molded packages, the silicon chips are bonded directly to a carrier with a die attach adhesive, and then encapsulated with 20 to 50 mils of an epoxy encapsulant. This encapsulated package must also be able to withstand the extreme stressing of wave soldering or reflow during the soldering process, and this has been largely accomplished with established epoxy materials. But this success has come only with limiting the size of the chips and the amount of the encapsulant, e.g., these packages are usually small, on the order of 100 mils square. Debonding of the chip relative to the board or relative to the encapsulant itself may occur in larger packages due to stressing at the interfaces caused by the absolute different relative expansion characteristics of the dissimilar materials. Simple physics relates the differential expansion to the linear expansion coefficient (CLE) times the temperature change ($\Delta T$) times the diagonal length (L) over which the attachment is made. Large packages of 1000 mils, for example, undergo at least 10-times the stressing of 100 mil packages.

The wider adoption of COB packaging has been limited by these debonding problems in the larger sizes of packages and by the limited supply of usable plastics. The desirability of COB packaging arises from its potential for providing substantially faster and less expensive manufacturing processes. In addition, the final package could be made lighter, thinner and, perhaps, even more flexible to meet the ever increasing demand for smaller electronic devices.

Prior to this invention, however, there has not been a plastics material which will achieve all the requirements of a wider footprint package while being able to be processed in accordance with present and forthcoming manufacturing standards.

The COB process can now be more widely adopted in the larger PCB applications, by virtue of the present invention composition which meets all applicable criteria, including:

1. The present encapsulant composition disperses from a robotic dispenser and has the capability of maintaining flow control within approximately 1 mil using robotics equipment having 3-axis x-y-z control with computerized dispensing. This equipment can be used to lay the encapsulant materials, e.g., by first laying down a thixotropic damming material in a square pattern around the ICs and then filling the dam-defined volume, which surrounds the IC with the encapsulant composition. The glob top encapsulant can also be used without a damming material, with control of sufficiency and depth of flow to totally and controllably encapsulate the IC. A typical volume would be 1000 mils square by 60 mils deep.
2. The present encapsulant composition is readily cured by various convenient means. Because there is little rise in temperature and low shrinkage during cure, there is minimal stressing at the bond lines and at the wire attachment.
3. The present encapsulant composition cures within a short period of time to allow fast processing.
4. The present encapsulant composition cures tack-free, enabling the immediate printing of a code number onto the encapsulant.
5. The present encapsulant composition when cured is substantially unaffected by high humidity, and will tolerate a period of up to a year or more in storage in high humidity environments, such as Southeast Asia, without absorbing detrimental amounts of moisture or other contaminants.
6. The present encapsulant composition is tenaciously adherent and high temperature resistant, enabling the package and its carrier attached to a PCB to be wave-soldered or solder-reflowed without the encapsulant debonding from the substrates, debonding from the chip, delaminating at any point within the structure, stressing or debonding thin gold wires or their attachment, or grossly deforming or bubbling by the process known as "pop-corning." Pop-corning is a side effect of encapsulants being subjected to the extremely fast heat rise when dipped into molten solder. Any entrapped moisture must escape before it vaporizes, or the plastic must withstand the extreme forces of moisture vaporization without passing these stressed onto the encapsulated components and wires. Failure to do so produces distortions similar to corn popping.

The present invention while meeting all the criteria for a COB encapsulant, importantly handles the stresses inherent in present and proposed manufacturing processes for COBs and ICs generally. The main ones of such stresses are at bond lines or at interfaces of the various materials of the package. These stress areas include:

1. The attachment area of the chip to the substrate with the "die attachment" adhesive.
2. The attachment areas of the encapsulant to the top and side of the chip, particularly to the edges and corners of the chip.
3. The attachment surface of the encapsulant to the substrate. And,
4. The attachment surfaces of the encapsulant to the gold wire and their wire attachments.

In terms of the encapsulant composition, and prescinding from steps to be taken with the substrates, the chips or the wire attachments, themselves, stresses developed by the encapsulant plastic involve the differential stresses at the bond lines between the plastic encapsulant and its substrates. Stressing can also occur within the encapsulant strictly from the residual shrinkage and the configuration of the mass but this is a lesser factor, like stressing from volatiles and vaporization of moisture, and these factors will not be discussed further.

The stress developed within a plastic due to a temperature excursion can be related to the mechanical properties of a plastic and/or to its thermodynamic properties. The present invention composition minimizes stress by stress relief through special thermodynamic properties attributable to the unique incorporation of a flexibilizing polymer into the cycloaliphatic isocyanate and aromatic diamine derived urethane polymers of the invention.

Most of the mechanical stress at the mentioned interfaces is related to the product of the modulus of the encapsulant composition and its coefficient of linear thermal expansion (CTE). Theoretically, it is desirable both to minimize the modulus (e.g. rigidity or hardness) and minimize the CTE. In virtually all plastics materials, however, the modulus is related inversely to CTE. Materials which have a low modulus have a high CTE and a plastic with a high modulus has a low CTE. Therefore, the conventional choice in encapsulants for COB applications is typically between a rigid encapsulant which comes close to matching the low CTE of the substrate and chip (high modulus solution) or a flexible encapsulant which badly mismatches the board and chip CTE but has the advantage of a low modulus and its associated flexibility (high flexibility solution).

A typical silicon chip has a CTE of 2 or 4 parts per million (ppm) per degree C. and the epoxy laminate (FR-4 board) or bismaleimide triazine (BT board) have CTEs of roughly 15 to 20 ppm per degree C. below the glass transition temperature (Tg) and 25 to 50 ppm per degree C. above the glass transition temperature. An encapsulant with a CTE intermediate between the substrate and the chip (say, 10 ppm per degree C.) will apparently minimize stresses. But only very high hardness, high modulus, rigid materials have such a low coefficient of expansion. Materials which fall into this range of CTE are mineral-filled epoxies, mineral-filled acrylics, mineral-filled cyanate esters, or other highly mineral-filled, cross-linked polymers. The negative trade-off is that each of these materials has a high modulus. Since the stress is derived by multiplying the modulus by the CTE, the high modulus value contributes to a large stress in these rigid encapsulants, particularly as the hoped-for intermediate CTE moves beyond the CTE of the chip or substrate with a rise in temperature.

The alternative of selecting more flexible materials which have a combination of low modulus and high CTE apparently creates the same dilemma as the rigid solution since stress is the multiplication product of CTE and modulus and the contribution of a high CTE would appear to be desirably avoided.

With the insight to a selection of flexibilized urethane polymers according to the present invention as the encapsulant, high CTE encapsulants can be formulated to with low modulus through the incorporation rubbery components segments in the polymers. The rubbery components confer an additional benefit to the overall stress relieving character of the encapsulant. The present composition act to distribute through the overall mass of the encapsulant those intermediate, localized stresses, allowing the overall structure to absorb and mitigate stresses and preserve the encapsulant integral even at areas of localized stress.

Not any high CTE, low modulus plastic will confer the mentioned benefit and be effective as an encapsulant, given the myriad of factors necessary in an IC manufacturing-useful plastic. Only the presently disclosed flexibilized urethane polymers have all the necessary attributes. Other high CTE and low modulus encapsulants include silicone rubbers and flexibilized epoxies. Silicone rubbers suffer from two deficiencies: (1) their fugitive oils contaminate all other bonded surfaces; (2) they do not provide much hermetic sealing since they are porous and allow ingress of moisture and salts. Flexibilized epoxies theoretically have merit as encapsulants, but these materials are difficult to formulate. The desired combination of resilience, high temperature properties and manufacturability has not been found in polymers before this invention with even urethane polymers being thought to have too poor high temperature qualities.

This reaction to urethane polymer encapsulants is erroneous, at least to the extent that it includes the presently disclosed urethane polymers which have a high degree of rubbery properties, which are thermodynamically reversible properties. Thus, the present compositions are able to take up the extreme stresses of solder dipping and pass these localized stresses, particularly at the gold wire attachments and at the chip and substrate interfaces, onto other portions of the encapsulant mass to maximize local stress relief.

These rubbery properties also work oppositely to relieve developed mechanical stresses. In the purest sense, thermodynamic stresses are more typically stress reliefs and are expressed as the temperature coefficient of force expressed closely by Kelvin's equation. These stresses (forces per unit area) are, due to the available intrinsic factors:
1. Directly proportional to the heat capacity (Cp-Cv) of any rubbery component within the plastic.
2. Inversely proportional to the rubbery CTE of the plastic.

These thermodynamic stresses are also directly proportional to the extrinsic factors of the differences between initial and final temperatures, the area of the mass, the density of the mass and inversely proportional to the thickness of the mass.

It has been discovered that flexible low modulus materials such as the herein described urethanes will reduce failures within these complex encapsulated IC constructions, and better than epoxies which typically do not have sufficient flexibility to withstand the rapid stressing. The invention compositions do not revert or decompose at the extreme temperatures expected to be encountered in a wave soldering machine, and they show excellent forgiveness of stresses within these composite structures, better than alternative epoxy or urethane polymers.

While not wishing to be bound to any particular assumptions or theory, it is believed that the present invention compositions are successful in relieving localized stresses due to stress-relief of the thermodynamic factors within the Z (vertical) component, the adhesive areas being constrained in the X and Y (horizontal) components.

Only certain urethane polymers will achieve this important high temperature result. Initially, the polymers must have carbon to carbon bonds between successive carbon atoms; no ether type linkages are to be present. Additionally, saturated, aliphatic di-isocyanate reagents provide substantially better temperature stability than aromatic isocyanates possibly due to the electron donating character of aliphatic groups to the resulting urethane or urea groups, which are formed after polymerization. And amine reagents to urethane polymers, rather than hydroxylated reagents, and particularly aromatic diamines provide substantially better stability than other active hydrogen groups, such as the hydroxyls. Typical polyether polyols such as polyoxy-poly propylene oxides or poly-tetramethylene oxides revert (break down) through their ether bonds. By contrast the strictly hydrocarbon bonds or hydrocarbons having ethylenic or pendant ethylenic bonds, i.e., bonds either saturated or unsaturated and such that there is no oxygen between adjacent, successive carbon atoms, provide substantial stability at high temperatures.

It is preferred to use an aliphatic isocyanate which is alicyclic such as methylene dicyclohexane diiocyanate. Other isocyanates include diphenylmethane diisocyanate, isocyanurate, and isophorone diisocyanate. In these isocyanates, the scission of one bridge does not result in total scission of the isocyanate moiety. It has been discovered that a further advantage accrues from the use of aliphatic reagents. Urethane polymers designed to have as much aliphatic hydrocarbon character for thermal stability, are also substantially hydrophobic. This characteristic tends to minimize the residual moisture content, assisting in the prevention of the pop-corning problem mentioned above.

Figure 3:
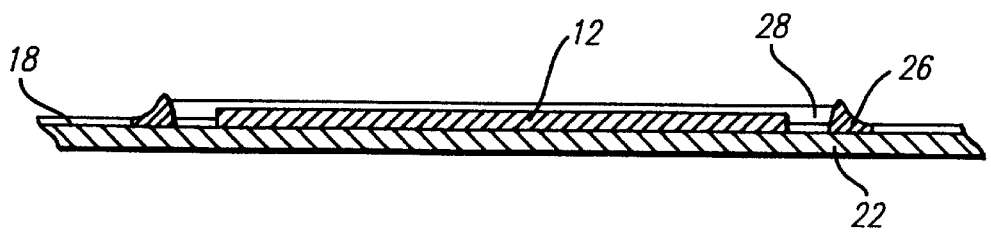
FIG. 3 is a view taken on line 3—3 in FIG. 2.
Figure 2:
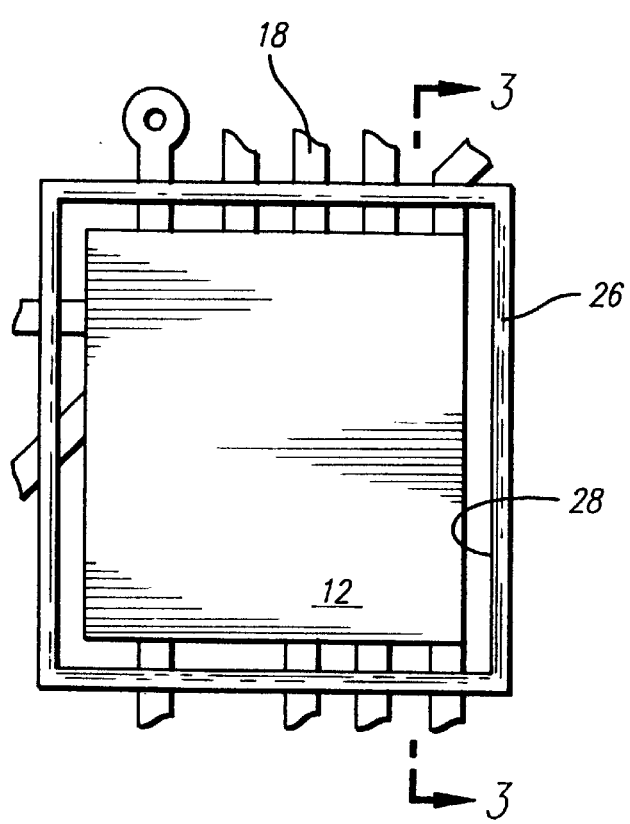
FIG. 2 is a fragmentary view generally like FIG. 1 but with only the dam in place, no encapsulant.
Figure 4:
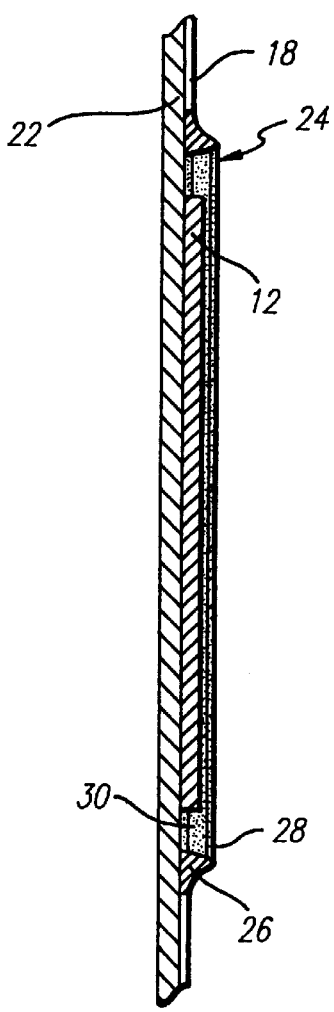
FIG. 4 is a view taken on line 4—4 in FIG. 1.

With reference to the drawings, the integrated circuit 10 includes components 12, 14 and 16, etc. arranged in association with plated conductive paths 18, 20, etc. on a circuit board 22. Component 12 is encapsulated with encapsulant 24 according to the invention. With particular reference to FIGS. 2–4, the encapsulated component 12 is framed by damming urethane polymer 26 according to the invention into an enclosing dam 28, the polymer being deposited from a static mixer leading from a pair of tubes containing A and B sides of the urethane polymer composition (not shown). The damming urethane polymer 26 has an organic or inorganic thixotroping agent within so as to not sag when applied. See FIGS. 2 and 4. Once the dame 28 has cured, or is sufficiently strong to enclose the encapsulant per se, an additional urethane polymer 30 is deposited within the volume defined by the dam, and typically to the height of the dam, but in any event in sufficient amount encapsulate the component 12. Polymer 30 is then cured.

The invention will be further explained with reference to a typical composition which is illustrative and not limitative of the scope of the invention.

EXAMPLES

An encapsulating composition was prepared as follows:

Example 1: Encapsulant

Part A
Step 1

28.00 grams of methylenedicyclohexane-4, 4'-diiocyanate (Desmodur W) were placed into a vessel, followed by 62.00 grams of hydroxy terminated 1'3-butadiene homopolymer (R45HT polybutadiene resin). Both materials were mixed and heated at 310° F. (154.4° C.) for 1 hour to make a pre-polymer.

Step 2

Once the Step 1 pre-polymer reaction was completed and the prepolymer cooled to room temperature, 10.00 grams of methylenedicyclohexane-4,4'-diisocyanate (Desmodur W) were added, followed by 1.00 gram of gamma-glycidoxypropyltrimethoxysilane (Silane A-187), mixed at room temperature, and then gassed at 5 mm Hg reduced pressure for approximately 15 minutes until bubbles disappeared. The resulting polymer Part A was packaged in one side of a 50 cc dual cartridge.

Part B
Step 1

83.00 grams of hydroxy terminated 1,3-butadine homopolymer (R45 HT polybutadine resin) were weighed into a cup, followed by 15.00 grams of diethyltoluenediamine (DETDA) and 0.50 grams of bismuth naphthenate (Coscat 83 Catalyst).

The mixture was mixed and heated at 212° F. (100° C.) for 15 minutes to de-water the system, degassed at −30 psi until bubbles disappeared, and packaged into the other side of the 50 cc dual cartridge.

Reaction of Example 1 Part A with Part B To Form Encapsulant

Parts A and B were pneumatically dispensed side-by-side through a static mixer-tip (nozzle), and with the help of and X-Y-Z motion dispenser, the material encapsulated a chip. The encapsulated chip was placed in an oven at 100° C. for 1 hour to post-cure the encapsulant, although the encapsulant cures at room temperature within 24 hours.

Example 2: Damming System with Chemical Thixotroping

Part A
Step 1

30.00 grams of methylenedicyclohexane-4, 4'-diisocyanate (Desmodur W) into a vessel followed by 52.00 grams of hydroxy terminated 1,3'-butadiene homopolymer (R45HT polybutadine resin). Both materials were mixed and heated at 130° F. (154.4° C.) for 1 hour to make a pre-polymer.

Step 2

Once the Step 1, pre-polymer, reaction was completed and cooled down at room temperature, 5.00 grams of dicyclohexane-4, 4-diisocyanate (Desmodur W) were added. The step 2 was blended thoroughly, and while blending, gradually 3.00 grams of pre-weighted silicon dioxide (Aerosil R-972) were added to created thixotropy. The Step 2 was continuously stirred, and further degassed at 5 mm. Hg reversed pressure until bubbles disappeared or within approximately 15 minutes.

Example 2, Part A was put into one side of a 50 cc dual cartridge (Mix Pac) to be mixed with Example 2, Part B.

Part B
Step 1

73.00 grams of hydroxy terminated 1,3'-butadine homopolymer (R45HT polybutadine resin) were weighed into a vessel followed by 10.80 grams of diethyltoluenediamine (DETDA), 3.00 grams of meta-xylylenediamine (MXDA), and 0.25 grams of bismuth naphthenate (Coscat 83). All the ingredients above were mixed and heated to 212° F. (100° C.) for 15 minutes to de-water the system, and cooled down to room temperature. 3.00 grams of pre-weighed silicon dioxide (Aerosil R-972) were gradually added to the mixture while stirring to create thixotropy. The mixture was then degassed at 5 mm. HG reversed pressure until bubbles disappeared or within approximately 15 minutes. Example 2, Part B was put into the other side of the 50 cc dual cartridge (MixPac).

Mixture of Example 2 Part A with Part B To Form Dam

Parts A and B were pneumatically dispensed side-by-side through a static mixer tip (nozzle); the chemical reaction between both parts instantly created a thixotropic mixture. With the help of an x-y-z motion dispenser, the material was dispensed around a chip creating a dam for a glob-top encapsulant. After encapsulation as in Example 1, within the dammed area, the encapsulated chip was placed in an oven at 212° F. (100° C.) for 1 hour to post-cure both the encapsulant and damming systems, although both material cure at room temperature within 24 hours.

Testing

IPC Process Specification

Samples of Examples 1 and 2 above were used to encapsulate IC chips supported on BT boards. In each instance a square pattern dam was formed about the chip. Immediately thereafter each dammed chip was encapsulated by injecting the encapsulant into the dam-formed cavity. Each chip, dam and encapsulant assembly was approximately 50 mm. high. Eighteen samples of this configuration were prepared and moisture conditioned to IPC SM 786A, paragraph 4.152, level 1, which represent an unlimited storage life at approximately 85% relative humidity.

The conditioning was accomplished in an environmental chamber set at 85° C. and 85% relative humidity for 168 hours. Within one hour of concluding conditioning, the test specimens were subject to 2 solder reflow cycles (450° F. at heating rate of 9° F. per second, followed by 20 second swell, and cooled to ambient). Test specimens were evaluated per criteria IPC SM 786A, Table 4.2 and found to past criteria 1. That is, there was not visual evidence of de-lamination or cracks observed by acoustic microscopy or other means.

That which is claimed is:

1. An encapsulated integrated circuit, said integrated circuit being encapsulated with flexibilized urethane polymer of an aliphatic isocyanate reagent, an isocyanate-reactive terminated flexibilizing polymer reagent, and a diamine reagent.

2. An encapsulated integrated circuit, said integrated circuit being encapsulated with a flexibilized urethane polymer, said urethane polymer comprising the reaction product with a difunctional amine of a urethane prepolymer reaction product of an aliphatic isocyanate reagent and an isocyanate-reactive terminated flexibilizing polymer reagent.

3. The encapsulated integrated circuit according to claim 2, in which said isocyanate-reactive flexibilizing polymer reagent comprises a polymer of butadiene terminated with isocyanate-reactive moieties.

4. The encapsulated integrated circuit according to claim 3, in which said isocyanate-reactive moieties comprise hydroxyl groups.

5. The encapsulated integrated circuit according to claim 4, in which said isocyanate-reactive flexibilizing polymer reagent has a molecular weight between about 50 and about 10,000.

6. The encapsulated integrated circuit according to claim 5, in which said isocyanate-reactive flexibilizing polymer before reaction with said isocyanate reagent is liquid and has an hydroxyl functionality of about 2.0 to 3.5.

7. The encapsulated integrated circuit according to claim 2, in which said aliphatic isocyanate reagent comprises a cycloaliphatic diiocyanate, diphenylmethane diisocyanate, isocyanurate, or isophorone diiocyanate.

8. The encapsulated integrated circuit according to claim 7, in which said cycloaliphatic diisocyanate comprises methylenedicyclohexane-4,4'-diisocyanate.

9. The encapsulated integrated circuit according to claim 2, in which said difunctional amine comprises an aromatic diamine.

10. The encapsulated integrated circuit according to claim 9, in which said aromatic diamine comprises diethyltoluenediamine or meta-xylenediamine.

11. The encapsulated integrated circuit according to claim 9, in which said aliphatic isocyanate reagent comprises a cycloaliphatic diisocyanate, diphenylmethane diisocyanate, isocyanurate, or isophorone diisocyanate.

12. The encapsulated integrated circuit according to claim 11, in which said cycloaliphatic diisocyanate comprises methylenedicyclohexane-4,4'-diisocyanate.

13. The encapsulated integrated circuit according to claim 12, in which said isocyanate-reactive flexibilizing polymer reagent comprises a polymer of butadiene terminated with isocyanate-reactive moieties.

14. The encapsulated integrated circuit according to claim 13, in which said isocyanate-reactive moieties comprise hydroxyl groups.

15. The encapsulated integrated circuit according to claim 14, in which said isocyanate-reactive flexibilizing polymer reagent has a molecular weight between about 50 and about 10,000.

16. The encapsulated integrated circuit according to claim 15, in which said isocyanate-reactive flexibilizing polymer before reaction with said isocyanate reagent is liquid and has an hydroxyl functionality of about 2.0 to 3.5.

17. The encapsulated integrated circuit according to claim 15, in which said isocyanate reagent comprises methylenedicyclohexane-4,4'-diisocyanate.

18. The encapsulated integrated circuit according to claim 17, in which said aromatic diamine comprises diethyltoluenediamine or meta-xylenediamine.

19. The encapsulated integrated circuit according to claim 15, in which said isocyanate reagent comprises diphenylymethane diisocyanate.

20. The encapsulated integrated circuit according to claim 19, in which said aromatic diamine comprises diethyltoluenediamine or meta-xylenediamine.

21. An encapsulated integrated circuit, said integrated circuit being encapsulated with a first and second flexibilized urethane polymer portions, said first polymer portion surrounding said integrated circuit in dam defining relation, said second polymer portion encapsulating said integrated circuit in dam confined relation.

22. The encapsulated integrated circuit according to claim 21, in which each of said first and second polymer portions comprises the reaction product with a difunctional aromatic amine of a urethane prepolymer reaction product of a saturated isocyanate reagent and an isocyanate-reactive terminated flexibilizing polymer reagent comprising a polymer of butadiene terminated with isocyanate-reactive moieties, said first polymer portion additionally comprising thixotroping agents in an amount flocking sagging of said dam defining first polymer portion.

23. The encapsulated integrated circuit according to claim 22, in which said thixotroping agent is organic.

24. Composition for environmentally protecting an integrated circuit, said composition comprising the urethane polymer reaction product of an aliphatic isocyanate reagent, an isocyanate-reactive terminated flexibilizing polymer reagent, and a diamine reagent under urethane polymer forming conditions.

25. The composition according to claim 24, in which said aliphatic isocyanate reagent is a cycloaliphatic isocyanate reagent, diphenylmethane diisocyanate, isocyanurate or isophorone diisocyanate.

26. The composition according to claim 25, in which said cycloaliphatic isocyanate reagent comprises methylenedicyclohexane-4,4'-diisocyanate.

27. The composition according to claim 26, in which said isocyanate-reactive flexibilizing polymer reagent comprises a polymer of butadiene terminated with isocyanate-reactive moieties.

28. The composition according to claim 27, in which said isocyanate-reactive moieties comprise hydroxyl groups.

29. The composition according to claim 28, in which said isocyanate-reactive flexibilizing polymer reagent has a molecular weight between about 50 and about 10,000.

30. The composition according to claim 27, in which said isocyanate-reactive flexibilizing polymer reagent has a molecular weight between about 1000 and 5000.

31. The composition according to claim 30, in which said isocyanate-reactive flexibilizing polymer before reaction with said isocyanate reagent is liquid and has an hydroxyl functionality of about 2.0 to 3.5.

32. The composition according to claim 29, in which said isocyanate reagent comprises methylenedicyclohexane-4,4'-diisocyanate.

33. The composition according to claim 32, in which said aromatic diamine comprises diethyltoluenediamine or meta-xylenediamine.

34. The composition according to claim 29, in which said isocyanate reagent comprises diphenylmethane diisocyanate.

35. The composition according to claim 34, in which said aromatic diamine comprises diethyltoluenediamine or meta-xylenediamine.

36. The composition according to claim 24, in which said urethane polymer is the reaction product of a first mixture comprising said isocyanate reagent and said flexibilizing polymer reagent and a second mixture comprising said diamine reagent and said flexibilizing polymer reagent.

37. The composition according to claim 24, in which said composition urethane polymer is free of ether bonds between successive carbon atoms.

38. The composition according to claim 36, in which said composition urethane polymer comprises solely hydrocarbon bonds between successive carbon atoms.

39. The combination of the composition of claim 24 and an integrated circuit environmentally protected by said composition.

* * * * *